(12) United States Patent
Xu

(10) Patent No.: US 10,211,399 B2
(45) Date of Patent: Feb. 19, 2019

(54) TRANSPARENT OLED DISPLAY AND MANUFACTURING METHOD THEREOF

(71) Applicant: Wuhan China Star Optoelectronics Technology Co., Ltd., Wuhan (CN)

(72) Inventor: Chao Xu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 189 days.

(21) Appl. No.: 15/326,639

(22) PCT Filed: Dec. 13, 2016

(86) PCT No.: PCT/CN2016/109567
§ 371 (c)(1),
(2) Date: Jan. 16, 2017

(87) PCT Pub. No.: WO2018/068379
PCT Pub. Date: Apr. 19, 2018

(65) Prior Publication Data
US 2018/0337336 A1 Nov. 22, 2018

(30) Foreign Application Priority Data
Oct. 11, 2016 (CN) .......................... 2016 1 0891514

(51) Int. Cl.
H01L 51/50 (2006.01)
H01L 51/00 (2006.01)
(Continued)

(52) U.S. Cl.
CPC ...... H01L 51/0024 (2013.01); H01L 27/3244 (2013.01); H01L 51/001 (2013.01);
(Continued)

(58) Field of Classification Search
CPC ......... H01L 51/50; H01L 51/52; H01L 51/56; H01L 51/5206; H01L 51/5221;
(Continued)

(56) References Cited

U.S. PATENT DOCUMENTS

2005/0009227 A1 1/2005 Xiao
2006/0038484 A1* 2/2006 Noh ..................... C07D 487/16
313/499

(Continued)

FOREIGN PATENT DOCUMENTS

CN 104966792 A 10/2015

Primary Examiner — Thanh T Nguyen
(74) Attorney, Agent, or Firm — Leong C. Lei

(57) ABSTRACT

The invention discloses a transparent OLED display and manufacturing method thereof. The present invention provides a manufacturing method of transparent OLED display, by preparing the cathode and the anode on two different substrates to effectively avoid the destruction of the light-emitting layer made of the organic light-emitting material caused by sputtering the anode at the top of OLED to improve yield rate. The use of the transparent conductive metal oxide to manufacture the cathode and the anode of the OLED display provides an effective solution to the manufacturing of transparent OLED display which requires high conductivity and high transparency for the electrode material. In addition, the two substrates can be manufactured the same time and then pressed to attach to achieve high manufacturing efficiency. The OLED display provided by the present invention is easy to manufacture and provides good performance.

10 Claims, 4 Drawing Sheets

(51) Int. Cl.
*H01L 51/52* (2006.01)
*H01L 51/56* (2006.01)
*H01L 27/32* (2006.01)

(52) U.S. Cl.
CPC ...... *H01L 51/0003* (2013.01); *H01L 51/0021* (2013.01); *H01L 51/0097* (2013.01); *H01L 51/5012* (2013.01); *H01L 51/5056* (2013.01); *H01L 51/5072* (2013.01); *H01L 51/5088* (2013.01); *H01L 51/524* (2013.01); *H01L 51/5206* (2013.01); *H01L 51/5234* (2013.01); *H01L 51/56* (2013.01); *H01L 51/0039* (2013.01); *H01L 51/0043* (2013.01); *H01L 2227/323* (2013.01); *H01L 2251/308* (2013.01); *H01L 2251/5338* (2013.01)

(58) Field of Classification Search
CPC ............. H01L 2251/50; H01L 51/5072; H01L 51/5012; H01L 51/5056; H01L 51/5234; H01L 2251/5338; H01L 2227/323; H01L 2227/32; H01L 27/3251
See application file for complete search history.

(56) References Cited

U.S. PATENT DOCUMENTS

2009/0130296 A1* 5/2009 Kwong ............... H01L 51/0005
 427/64
2017/0324049 A1* 11/2017 Tsai ........................ C09K 11/06
2018/0138419 A1* 5/2018 Dyatkin ............. H01L 51/0067

* cited by examiner

TRANSPARENT OLED DISPLAY AND MANUFACTURING METHOD THEREOF

BACKGROUND OF THE INVENTION

1. Field of the Invention

The present invention relates to the field of display techniques, and in particular to a transparent OLED display and manufacturing method thereof.

2. The Related Arts

The organic light emitting diode (OLED) display, also called organic electroluminescent display, is the new trend of flat panel display technology. Because the OLED display provides the advantages of simple manufacturing process, low cost, low power-consumption, high illumination, wide operating temperature range, thin size, short response time, enabling full-color large display, easy to match integrated circuit (IC) driver, and enabling flexible display, the OLED is recognized as the technology with widest application prospect.

The driving types of OLED can be divided according to the passive matrix OLED (PMOLED) and active matrix OLED (AMOLED), i.e., the direct addressable type and thin film transistor (TFT) addressable type, wherein the AMO-LED provides the advantages of pixels arranged in an array, self-luminous, and high luminous efficiency and is commonly used for high definition large-size display.

In general, the structure of an OLED display comprises: a substrate, an anode disposed on the substrate, a hole inject layer (HIL) disposed on the anode, a hole transport layer (HTL) disposed on the HIL, a light-emitting layer disposed on the HTL, an electron transport layer (ETL) disposed on the light-emitting layer, an electron inject layer (EIL) disposed on the ETL, and a cathode disposed on the EIL. The light-emission principle of the OLED display is that the semiconductor material and the organic light-emitting material emit light through the carrier injection and compound driven by an electric field. Specifically, the OLED display usually uses ITO pixel electrode and metal electrode respectively for the anode and cathode. Under a specific voltage driving, the electrons and holes are injected into the ETL and HTL respectively from the cathode and anode. The electrons and the holes are migrated respectively to the light-emitting layer and encounter each other to form excitons and excite the light-emitting molecules, which emit visible lights through radiation relaxation.

As the technology rapidly progresses, the transparent display technology is proposed due to the novelty display means. The transparent display device allows the viewer to see the images displayed by the display and the actual background behind the display. The transparent display has many possible applications, such as, window display for building or vehicles. Other than those large-area applications, the transparent display is also applicable to handheld devices, such as, viewing a map while also viewing the view behind the display. The majority of current display market is estimated to be replaced by the transparent displays, for example, in building, advertisements, and public information applications.

Compared to TFT-LCD, the OLED provides the advantages of the ability to realize large-sized, ultra-thin, flexible and transparent displays. The manufacturing of transparent OLED display needs to solve the problem of transparent electrodes as the material for transparent electrodes must provide higher conductivity and high penetration rate. The main material for transparent electrode currently is ITO, which is often manufactured by sputtering process. The sputtering process may damage the organic light-emitting layer f OLED when a too-high power is applied, and suffers a too-long film forming time and low yield rate when a too-low power is applied.

SUMMARY OF THE INVENTION

The object of the present invention is to provide a manufacturing method of transparent OLED display to improve yield rate and production efficiency.

Another object of the present invention is to provide a transparent OLED display, which is easy to manufacture and provides high performance.

To achieve the above object, the present invention provides a manufacturing method of transparent OLED display, which comprises: Step 1: providing a thin film transistor (TFT) array substrate, forming a cathode, an electron transport layer (ETL), a light-emitting layer and a hole transport layer (HTL) sequentially on the TFT array substrate to form a lower substrate, wherein the cathode being a transparent electrode, the HTL being made of an organic material with positive radicals; Step 2: providing an encapsulating cover plate, and forming an anode and a hole inject layer (HIL) on the encapsulating cover layer sequentially to form an upper substrate, wherein the anode being a transparent electrode, the HIL being made of an organic material with negative radicals; execution order of Step 1 and Step 2 being exchangeable; Step 3: laminating the upper substrate and the lower substrate in accordance with attaching the HTL and the HIL correspondingly, the positive radicals on the surface of the HTL and the negative radicals on the surface of the HIL mutually attracted by Cullen force to create chemical reaction so that the upper substrate and the lower substrate being tightly attached to form a transparent OLED display; wherein the positive radicals comprising at least one of $NH_3^+$ and $H^+$, and the negative radicals comprising at least one of $COO^-$, $OH^-$ and $Cl^-$.

According to a preferred embodiment of the present invention, in Step 1, a spin coating process or a spraying process is used to form the ETL on the cathode; a spin coating process or an evaporation process is used to form the light-emitting layer on the ETL, and a spin coating process or a spraying process is used to form the HTL on the light-emitting layer.

According to a preferred embodiment of the present invention, the materials of the cathode and the materials of the anode both comprise transparent conductive metal oxide.

According to a preferred embodiment of the present invention, the materials of the ETL comprise at least one of zinc oxide and poly [9,9-dioctafluorene-9,9-bis (N, N-dimethylaminopropyl) fluorene].

According to a preferred embodiment of the present invention, Step 3 is performed in a vacuum environment and under heated condition, and the temperature range is 100° C.–400° C.

Another embodiment of the present invention provides a transparent OLED display, which comprises: an upper substrate and a lower substrate attached correspondingly; the upper substrate further comprising: an encapsulating cover plate, an anode disposed on the encapsulating plate, and a hole inject layer (HIL) disposed on the anode; the lower substrate comprising: a thin film transistor (TFT) array substrate, a cathode disposed on the TFT array substrate, an electron transport layer (ETL) disposed on the cathode, a light-emitting layer disposed on the ETL, and a hole transport layer (HTL) disposed on the light-emitting layer; both the cathode and anode being transparent electrodes; the HTL being made of an organic material with positive radicals; the HIL being made of an organic material with negative radicals; wherein the upper substrate and the lower substrate being laminated in accordance with attaching the HTL and the HIL correspondingly, the positive radicals on the surface of the HTL and the negative radicals on the surface of the HIL mutually attracted by Cullen force to create chemical reaction so that the upper substrate and the lower substrate being tightly attached to form a transparent OLED display.

According to a preferred embodiment of the present invention, the positive radicals comprise at least one of $NH_3^+$ and $H^+$, and the negative radicals comprise at least one of $COO^-$, $OH^-$ and $Cl^-$.

According to a preferred embodiment of the present invention, the materials of the cathode and the materials of the anode both comprise transparent conductive metal oxide.

According to a preferred embodiment of the present invention, the materials of the ETL comprise at least one of zinc oxide and poly [9,9-dioctafluorene-9,9-bis (N, N-dimethylaminopropyl) fluorene].

Yet another embodiment of the present invention provides a manufacturing method of transparent OLED display, which comprises: Step 1: providing a thin film transistor (TFT) array substrate, forming a cathode, an electron transport layer (ETL), a light-emitting layer and a hole transport layer (HTL) sequentially on the TFT array substrate to form a lower substrate, wherein the cathode being a transparent electrode, the HTL being made of an organic material with positive radicals; Step 2: providing an encapsulating cover plate, and forming an anode and a hole inject layer (HIL) on the encapsulating cover layer sequentially to form an upper substrate, wherein the anode being a transparent electrode, the HIL being made of an organic material with negative radicals; execution order of Step 1 and Step 2 being exchangeable; Step 3: laminating the upper substrate and the lower substrate in accordance with attaching the HTL and the HIL correspondingly, the positive radicals on the surface of the HTL and the negative radicals on the surface of the HIL mutually attracted by Cullen force to create chemical reaction so that the upper substrate and the lower substrate being tightly attached to form a transparent OLED display; wherein the positive radicals comprising at least one of $NH_3^+$ and $H^+$, and the negative radicals comprising at least one of $COO^-$, $OH^-$ and $Cl^-$; wherein, in Step 1, a spin coating process or a spraying process is used to form the ETL on the cathode; a spin coating process or an evaporation process is used to form the light-emitting layer on the ETL, and a spin coating process or a spraying process is used to form the HTL on the light-emitting layer.

Compared to the known techniques, the present invention provides the following advantages. The present invention provides a manufacturing method of transparent OLED display, by preparing the cathode and the anode on two different substrates to effectively avoid the destruction of the light-emitting layer made of the organic light-emitting material caused by sputtering the anode at the top of OLED to improve yield rate. The use of the transparent conductive metal oxide to manufacture the cathode and the anode of the OLED display provides an effective solution to the manufacturing of transparent OLED display which requires high conductivity and high transparency for the electrode material. In addition, the two substrates can be manufactured the same time and then pressed to attach to achieve high manufacturing efficiency. The OLED display provided by the present invention is easy to manufacture and provides good performance.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
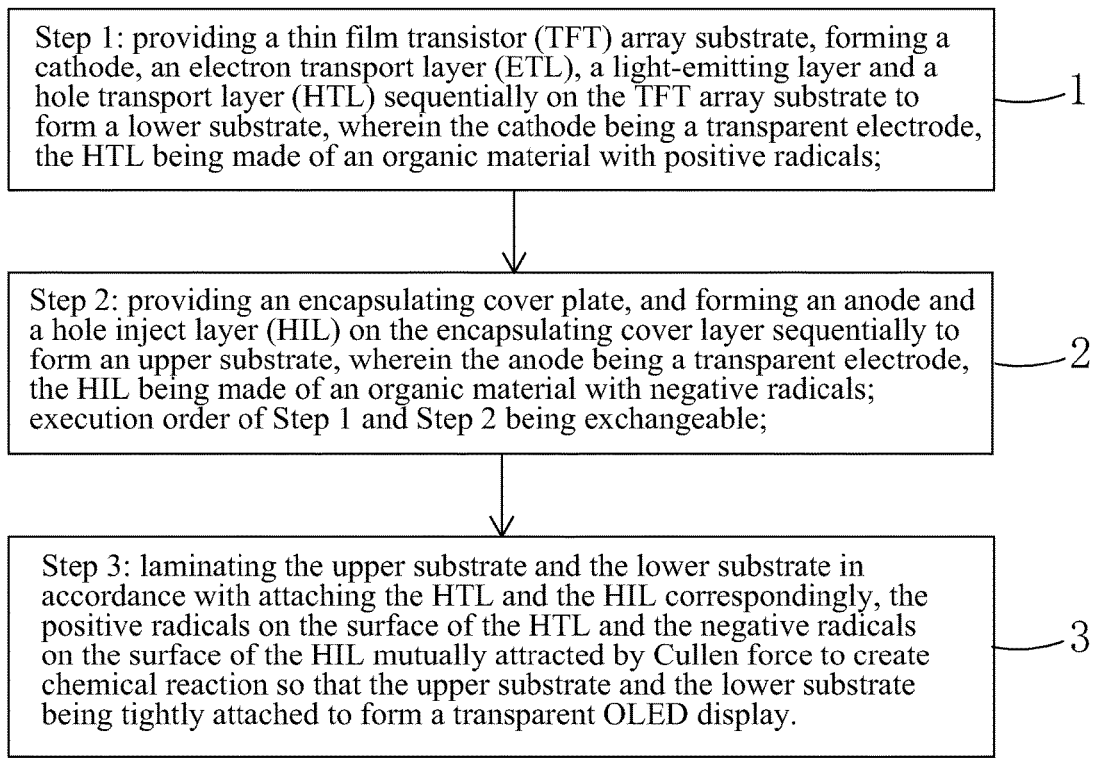
FIG. 1 is a schematic view showing the flowchart of the manufacturing method of OLED display provided by an embodiment of the present invention.
Figure 2:
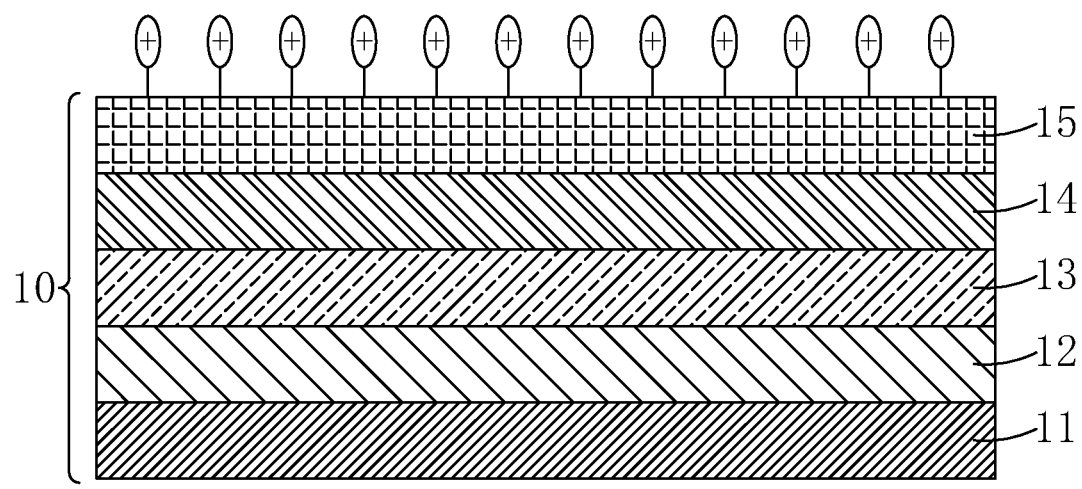
FIG. 2 is a schematic view showing Step 1 of the manufacturing method of OLED display provided by an embodiment of the present invention.

Referring to FIG. 1, the present invention provides a manufacturing method transparent OLED display, which comprises the following steps:

Step 1: as shown in FIG. 2, providing a thin film transistor (TFT) array substrate 11, forming a cathode 12, an electron transport layer (ETL) 13, a light-emitting layer 14 and a hole transport layer (HTL) 15 sequentially on the TFT array substrate 11 to form a lower substrate 10.

Wherein, the cathode 12 is a transparent electrode.

The HTL 15 is made of an organic material with positive radicals.

Preferably, the positive radicals comprise at least one of $NH_3^+$ and $H^+$.

Specifically, a spin coating process or a spraying process is used to form the ETL 13 on the cathode 12; a spin coating process or an evaporation process is used to form the light-emitting layer 14 on the ETL 13, and a spin coating process or a spraying process is used to form the HTL 15 on the light-emitting layer 15.

Preferably, the materials of the ETL 13 comprise at least one of zinc oxide (ZnO) and poly [9,9-dioctafluorene-9,9-bis (N, N-dimethylaminopropyl) fluorene] (PFN).

Specifically, the materials for the light-emitting layer 14 comprise organic light-emitting materials.

Optionally, Step 1 further comprises a step of forming an electron inject layer between the cathode 12 and the ETL 13.

Figure 3:
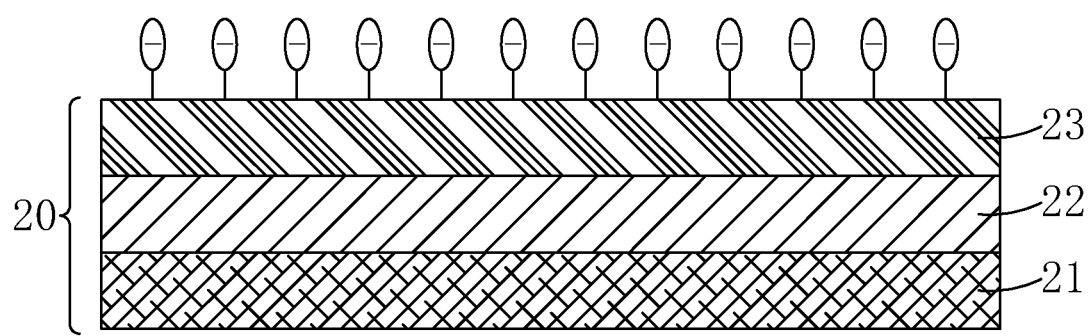
FIG. 3 is a schematic view showing Step 2 of the manufacturing method of OLED display provided by an embodiment of the present invention.

Step 2: as shown in FIG. 3, providing an encapsulating cover plate 21, and forming an anode 22 and a hole inject layer (HIL) 23 on the encapsulating cover layer 21 sequentially to form an upper substrate 20.

Wherein, the anode 22 is a transparent electrode.

The HIL 23 is made of an organic material with negative radicals.

Specifically, the execution order of Step 1 and Step 2 is exchangeable.

Preferably, the negative radicals comprise at least one of $COO^-$, $OH^-$ and $Cl^-$.

Specifically, the materials of the cathode 12 and the materials of the anode 22 both comprise transparent conductive metal oxide, and the transparent conductive metal oxide is preferably indium tin oxide (ITO).

Specifically, the organic material with positive radicals in the HTL 15 and the organic material with negative radicals in the HIL 23 are respectively a hole transport material and a hole inject material commonly used in the known technology. The chemical treatment of these materials can be performed to made these materials carrying positive and negative radicals, respectively.

Specifically, the encapsulating cover plate 21 is a glass substrate or a plastic substrate.

Figure 4:
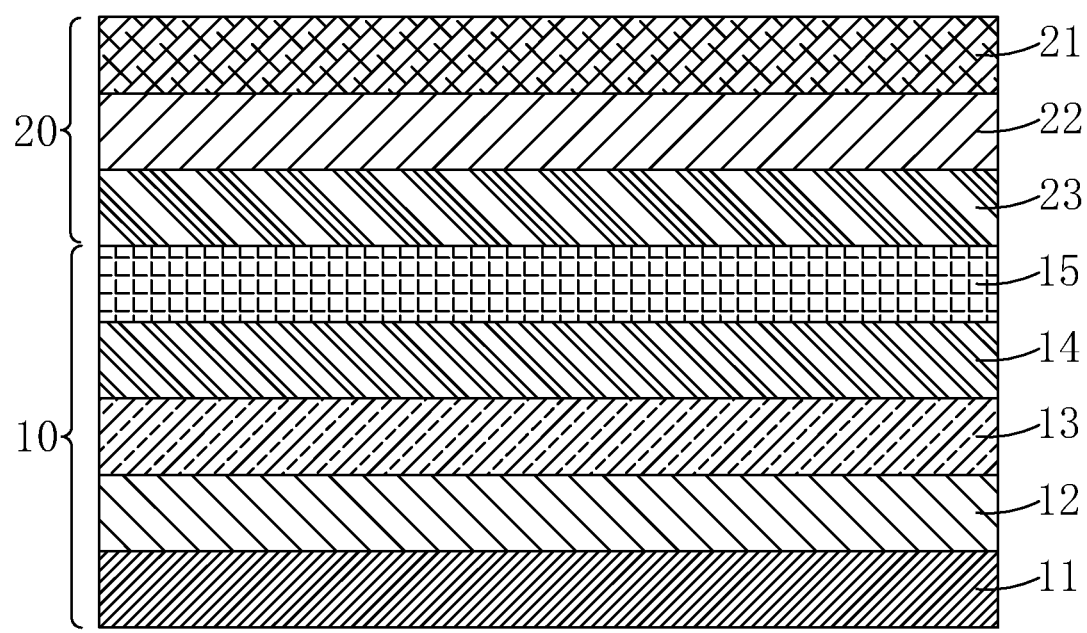
FIG. 4 is a schematic view showing Step 3 of the manufacturing method of OLED display provided by an embodiment of the present invention, and the structure of the transparent OLED display provided by an embodiment of the present invention.

Step 3: as shown in FIG. 4, laminating the upper substrate 20 and the lower substrate 10 in accordance with attaching the HTL 15 and the HIL 23 correspondingly, the positive radicals on the surface of the HTL 15 and the negative radicals on the surface of the HIL 23 mutually attracted by Cullen force to create chemical reaction so that the upper substrate 20 and the lower substrate 10 being tightly attached to form a transparent OLED display.

Preferably, Step 3 is performed in a vacuum environment and under heated condition, and the temperature range is 100° C.-400° C., and preferably, 200° C. The heating can be performed by placing the upper substrate 20 on a heating plate, and placing the lower substrate 10 on top of the upper substrate 20, and followed by pressing together.

Specifically, in Step 3, the heating of the upper substrate 20 and the lower substrate 10 can make the attachment the upper substrate 20 and the lower substrate 10 tighter.

The aforementioned manufacturing method, by preparing the cathode 12 and the anode 22 on two different substrates, effectively avoids the destruction of the light-emitting layer 14 made of the organic light-emitting material caused by sputtering the anode 22 at the top of OLED and improves yield rate. The use of the transparent conductive metal oxide to manufacture the cathode 12 and the anode 22 of the OLED display provides an effective solution to the manufacturing of transparent OLED display which requires high conductivity and high transparency for the electrode material. In addition, the two substrates can be manufactured the same time and then pressed to attach to achieve high manufacturing efficiency. The OLED display provided by the present invention is easy to manufacture and provides good performance.

Referring to FIG. 4, based on the aforementioned manufacturing method of transparent OLED display, the present invention also provides a transparent OLED display, which comprises: an upper substrate 20 and a lower substrate 10 attached correspondingly. The upper substrate 20 further comprises: an encapsulating cover plate 21, an anode 22 disposed on the encapsulating plate 21, and a hole inject layer (HIL) 23 disposed on the anode 22.

The lower substrate 10 comprises: a thin film transistor (TFT) array substrate 11, a cathode 12 disposed on the TFT array substrate 11, an electron transport layer (ETL) 13 disposed on the cathode 12, a light-emitting layer 14 disposed on the ETL 13, and a hole transport layer (HTL) 15 disposed on the light-emitting layer 14.

Both the cathode 12 and anode 22 are transparent electrodes; the HTL 15 is made of an organic material with positive radicals; and the HIL 23 is made of an organic material with negative radicals.

Wherein, the upper substrate 20 and the lower substrate 10 are laminated in accordance with attaching the HTL 15 and the HIL 23 correspondingly. The positive radicals on the surface of the HTL 15 and the negative radicals on the surface of the HIL 23 are mutually attracted by Cullen force to create chemical reaction so that the upper substrate 20 and the lower substrate 10 are tightly attached to form a transparent OLED display.

Preferably, the positive radicals comprise at least one of $NH_3^+$ and $H^+$, and the negative radicals comprise at least one of $COO^-$, $OH^-$ and $Cl^-$.

Preferably, the materials of the cathode 12 and the materials of the anode 22 both comprise transparent conductive metal oxide, and the transparent conductive metal oxide is preferably indium tin oxide (ITO).

Preferably, the materials of the ETL 13 comprise at least one of zinc oxide (ZnO) and poly [9,9-dioctafluorene-9,9-bis (N, N-dimethylaminopropyl) fluorene] (PFN).

Specifically, the materials for the light-emitting layer 14 comprise organic light-emitting materials.

Specifically, in the lower substrate 10, an electron inject layer is may be further formed between the cathode 12 and the ETL 13.

Specifically, the encapsulating cover plate 21 is a glass substrate or a plastic substrate.

The aforementioned OLED display is easy to manufacture and provides good performance. In addition, by disposing the cathode 12 on the TFT array substrate 11, and the top electrode provided as the anode 22, an inverted (i.e., upside down) OLED structure is formed. The use of the inverted OLED structure can prolong the lifespan of the OLED display. This is because the inverted OLED structure uses ITO for the cathode 12. Compared to common OLED using a material such as aluminum, the ITO for the cathode 12 greatly improves the atmospheric stability of the cathode 12. In addition, the electron inject layer or the electron transport layer 13 above the cathode 12 can achieve oxygen- and water-resistant properties by using an inert material, which is particularly advantageous in a flexible OLED display because the necessity of using a high barrier hard encapsulating material is reduced. Another advantage of using an inverted OLED structure is that the driving stability of an active matrix (AM)-typed display using an n-type TFT is improved.

In summary, the present invention provides a transparent OLED display and manufacturing method thereof. The present invention provides a manufacturing method of transparent OLED display, by preparing the cathode and the anode on two different substrates to effectively avoid the destruction of the light-emitting layer made of the organic light-emitting material caused by sputtering the anode at the top of OLED to improve yield rate. The use of the transparent conductive metal oxide to manufacture the cathode and the anode of the OLED display provides an effective solution to the manufacturing of transparent OLED display which requires high conductivity and high transparency for the electrode material. In addition, the two substrates can be manufactured the same time and then pressed to attach to achieve high manufacturing efficiency. The OLED display provided by the present invention is easy to manufacture and provides good performance.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of transparent organic light-emitting diode (OLED) display, which comprises:
    Step 1: providing a thin film transistor (TFT) array substrate, forming a cathode, an electron transport layer (ETL), a light-emitting layer and a hole transport layer (HTL) sequentially on the TFT array substrate to form a lower substrate, wherein the cathode being a transparent electrode, the HTL being made of an organic material with positive radicals;
    Step 2: providing an encapsulating cover plate, and forming an anode and a hole inject layer (HIL) on the encapsulating cover layer sequentially to form an upper substrate, wherein the anode being a transparent electrode, the HIL being made of an organic material with negative radicals; execution order of Step 1 and Step 2 being exchangeable;
    Step 3: laminating the upper substrate and the lower substrate in accordance with attaching the HTL and the HIL correspondingly, the positive radicals on the surface of the HTL and the negative radicals on the surface of the HIL mutually attracted by Cullen force to create chemical reaction so that the upper substrate and the lower substrate being tightly attached to form a transparent OLED display.

2. The manufacturing method of transparent OLED as claimed in claim 1, wherein the positive radicals comprise at least one of $NH_3^+$ and $H^+$, and the negative radicals comprise at least one of $COO^-$, $OH^-$ and $Cl^-$.

3. The manufacturing method of transparent OLED as claimed in claim 1, wherein in Step 1, a spin coating process or a spraying process is used to form the ETL on the cathode; a spin coating process or an evaporation process is used to form the light-emitting layer on the ETL, and a spin coating process or a spraying process is used to form the HTL on the light-emitting layer.

4. The manufacturing method of transparent OLED as claimed in claim 1, wherein the materials of the cathode and the materials of the anode both comprise transparent conductive metal oxide.

5. The manufacturing method of transparent OLED as claimed in claim 1, wherein the materials of the ETL comprise at least one of zinc oxide and poly [9,9-dioctafluorene-9,9-bis (N, N-dimethylaminopropyl) fluorene].

6. The manufacturing method of transparent OLED as claimed in claim 1, wherein Step 3 is performed in a vacuum environment and under heated condition, and the temperature range is 100° C.–400° C.

7. A manufacturing method of transparent organic light-emitting diode (OLED) display, which comprises:
    Step 1: providing a thin film transistor (TFT) array substrate, forming a cathode, an electron transport layer (ETL), a light-emitting layer and a hole transport layer (HTL) sequentially on the TFT array substrate to form a lower substrate, wherein the cathode being a transparent electrode, the HTL being made of an organic material with positive radicals;
    Step 2: providing an encapsulating cover plate, and forming an anode and a hole inject layer (HIL) on the encapsulating cover layer sequentially to form an upper substrate, wherein the anode being a transparent electrode, the HIL being made of an organic material with negative radicals; execution order of Step 1 and Step 2 being exchangeable;
    Step 3: laminating the upper substrate and the lower substrate in accordance with attaching the HTL and the HIL correspondingly, the positive radicals on the surface of the HTL and the negative radicals on the surface of the HIL mutually attracted by Cullen force to create chemical reaction so that the upper substrate and the lower substrate being tightly attached to form a transparent OLED display;
    wherein the positive radicals comprising at least one of $NH_3^+$ and $H^+$, and the negative radicals comprising at least one of $COO^-$, $OH^-$ and $Cl^-$;
    wherein in Step 1, a spin coating process or a spraying process being used to form the ETL on the cathode; a spin coating process or an evaporation process being used to form the light-emitting layer on the ETL, and a spin coating process or a spraying process beings used to form the HTL on the light-emitting layer.

8. The manufacturing method of transparent OLED as claimed in claim 7, wherein the materials of the cathode and the materials of the anode both comprise transparent conductive metal oxide.

9. The manufacturing method of transparent OLED as claimed in claim 7, wherein the materials of the ETL comprise at least one of zinc oxide and poly [9,9-dioctafluorene-9,9-bis (N, N-dimethylaminopropyl) fluorene].

10. The manufacturing method of transparent OLED as claimed in claim 7, wherein Step 3 is performed in a vacuum environment and under heated condition, and the temperature range is 100° C.-400° C.

* * * * *